(12) United States Patent
Luo et al.

(10) Patent No.: US 12,191,182 B2
(45) Date of Patent: Jan. 7, 2025

(54) SEMICONDUCTOR DEVICE

(71) Applicant: United Microelectronics Corp., Hsinchu (TW)

(72) Inventors: Nuo Wei Luo, Singapore (SG); Huabiao Wu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/987,867

(22) Filed: Nov. 16, 2022

(65) Prior Publication Data
US 2023/0073022 A1 Mar. 9, 2023

Related U.S. Application Data

(62) Division of application No. 16/931,277, filed on Jul. 16, 2020, now Pat. No. 11,527,428.

(30) Foreign Application Priority Data

Jun. 5, 2020 (CN) .......................... 202010506377.X

(51) Int. Cl.
*H01L 21/68* (2006.01)
*G03F 7/00* (2006.01)
(Continued)

(52) U.S. Cl.
CPC ........ *H01L 21/682* (2013.01); *G03F 7/70633* (2013.01); *H01L 21/027* (2013.01); *H01L 23/544* (2013.01)

(58) Field of Classification Search
CPC ... H01L 21/682; H01L 21/027; H01L 23/544; H01L 2223/5442; H01L 2223/54426;
(Continued)

(56) References Cited

U.S. PATENT DOCUMENTS

2002/0005594 A1* 1/2002 Iwamatsu ......... H01L 21/76232
257/E21.549
2003/0082882 A1* 5/2003 Babcock ............. H01L 29/7317
257/E21.372
(Continued)

FOREIGN PATENT DOCUMENTS

CN 101030048 9/2007
CN 103065929 4/2013
(Continued)

OTHER PUBLICATIONS

Warren W. Flack et al., "Verification of Back-to-Front Side Alignment for Advanced Packaging", International Wafer-Level Packaging Conference 2012, Nov. 5, 2012, pp. 1-7.
(Continued)

*Primary Examiner* — Mohammed Shamsuzzaman
(74) *Attorney, Agent, or Firm* — JCIPRNET

(57) ABSTRACT

Provided is a semiconductor device includes a substrate, an isolation structure, an alignment mark, and a dielectric layer. The substrate includes a first region and a second region. The isolation structure is disposed in the substrate in the first region, wherein the isolation structure extends from a first surface of the substrate toward a second surface of the substrate.
The alignment mark is disposed in the substrate in the second region. The alignment mark extends from the first surface of the substrate toward the second surface of the substrate and at the same level as the isolation structure. The dielectric layer is buried in the substrate in the second region and overlapping the alignment mark.

10 Claims, 14 Drawing Sheets

(51) Int. Cl.
*H01L 21/027* (2006.01)
*H01L 23/544* (2006.01)

(58) Field of Classification Search
CPC ..... H01L 2223/54453; H01L 21/76224; H01L 21/0274; H01L 21/02107; H01L 21/0214; H01L 21/02164; G03F 7/70633; G03F 9/7084

See application file for complete search history.

(56) References Cited

U.S. PATENT DOCUMENTS

| | | | | |
|---|---|---|---|---|
| 2005/0250289 | A1* | 11/2005 | Babcock | H01L 29/7378 257/E21.612 |
| 2009/0042357 | A1* | 2/2009 | O'Connell | H01L 27/0921 257/E21.54 |
| 2009/0321888 | A1* | 12/2009 | Liu | H01L 23/544 257/E23.179 |
| 2013/0214337 | A1 | 8/2013 | Kashihara | |
| 2015/0137358 | A1* | 5/2015 | Yanagisawa | H01L 23/481 257/737 |
| 2015/0206873 | A1 | 7/2015 | Chang et al. | |
| 2016/0043038 | A1* | 2/2016 | Chiang | H01L 29/785 257/774 |
| 2016/0204128 | A1* | 7/2016 | Baars | H01L 29/0847 257/350 |
| 2018/0033735 | A1* | 2/2018 | Ozawa | G03F 9/7088 |
| 2019/0088493 | A1* | 3/2019 | Watanabe | H10B 43/35 |
| 2020/0321249 | A1* | 10/2020 | Chang | H01L 23/481 |

FOREIGN PATENT DOCUMENTS

| | | | | | |
|---|---|---|---|---|---|
| CN | 102157365 | B | * | 7/2013 | ....... H01L 21/76898 |
| CN | 105304566 | | | 2/2016 | |
| CN | 109638026 | A | * | 4/2019 | ......... H01L 27/1463 |
| CN | 112310134 | A | * | 2/2021 | ............ H01L 21/68 |
| JP | 2001307999 | | | 11/2001 | |
| TW | 201314872 | A | * | 4/2013 | ....... H01L 21/76898 |
| WO | WO-2019111373 | A1 | * | 6/2019 | ....... H01L 21/76898 |

OTHER PUBLICATIONS

"Office Action of China Counterpart Application", issued on Nov. 25, 2023, pp. 1-7.

* cited by examiner

SEMICONDUCTOR DEVICE

CROSS-REFERENCE TO RELATED APPLICATION

This application is a divisional application of and claims the priority benefit of U.S. application Ser. No. 16/931,277, filed on Jul. 16, 2020, which claims the priority benefit of China application serial no. 202010506377.X, filed on Jun. 5, 2020. The entirety of each of the above-mentioned patent applications is hereby incorporated by reference herein and made a part of this specification.

BACKGROUND

Technical Field

The present invention relates to an integrated circuit and a manufacturing method thereof, and particularly relates to a semiconductor device and a manufacturing method thereof.

Description of Related Art

In the semiconductor manufacturing process, especially after the devices are scaled down, alignment accuracy becomes more and more important. When forming a component on the back side of a wafer, a light must have pass through the wafer by a through silicon alignment, so that a photomask may be aligned to an alignment mark in the wafer. However, if a thicker thinned substrate is needed, it is difficult to perform the alignment because the thickness of the silicon substrate is too thick to allow the through silicon alignment (TSA) process.

SUMMARY

The invention provides a semiconductor device and a manufacturing method thereof, which may improve the alignment ability during forming a component in or on the back side of a wafer.

An embodiment of the present invention provides a method for manufacturing a semiconductor device, including: providing a substrate, the substrate including a first region and a second region; forming a material layer on a first surface in the first region and the second region of the substrate, and forming an alignment mark on the first surface of the second region of the substrate; introducing heteroatoms from a second surface of the substrate into the substrate in the second region; and reacting the heteroatoms with the substrate to form a dielectric layer, the dielectric layer overlapping the alignment mark in the substrate in the second region.

According to the embodiment of the present invention, the method of introducing the heteroatoms from the second surface of the substrate into the substrate in the second region includes: forming a mask layer on the second surface of the substrate; performing a notch alignment by aligning a notch of the substrate; patterning the mask layer to form an opening in the second region, the opening corresponds to the alignment mark; performing an ion implantation process; and removing the mask layer.

An embodiment of the present invention provides a method for manufacturing a semiconductor device, including: providing a substrate, the substrate including a first region and a second region; introducing heteroatoms into the substrate in the second region from a first surface of the substrate; forming a material layer on the first surface of the substrate in the first region and the second region, and forming an alignment mark in the substrate in the second region; and reacting the heteroatoms with the substrate to form a dielectric layer overlapping the alignment mark in the substrate in the second region.

According to the embodiment of the present invention, the method of introducing the heteroatoms from the first surface of the substrate into the substrate in the second region includes: forming a mask layer on the first surface of the substrate; performing a notch alignment by aligning an notch of the substrate; patterning the mask layer to form an opening in the mask layer in the second region, the opening corresponds to the alignment mark; performing an ion implantation process; and removing the mask layer.

An embodiment of the present invention provides a semiconductor device, including: a substrate including a first region and a second region; an isolation structure in the substrate in the first region, wherein the isolation structure extends from a first surface of the substrate to a second surface of the substrate; an alignment mark in the substrate in the second region, wherein the alignment mark extends from the first surface of the substrate to the second surface of the substrate and is at the same level as the isolation structure; and a dielectric layer in the substrate in the second region and overlapping with the alignment mark.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 6:
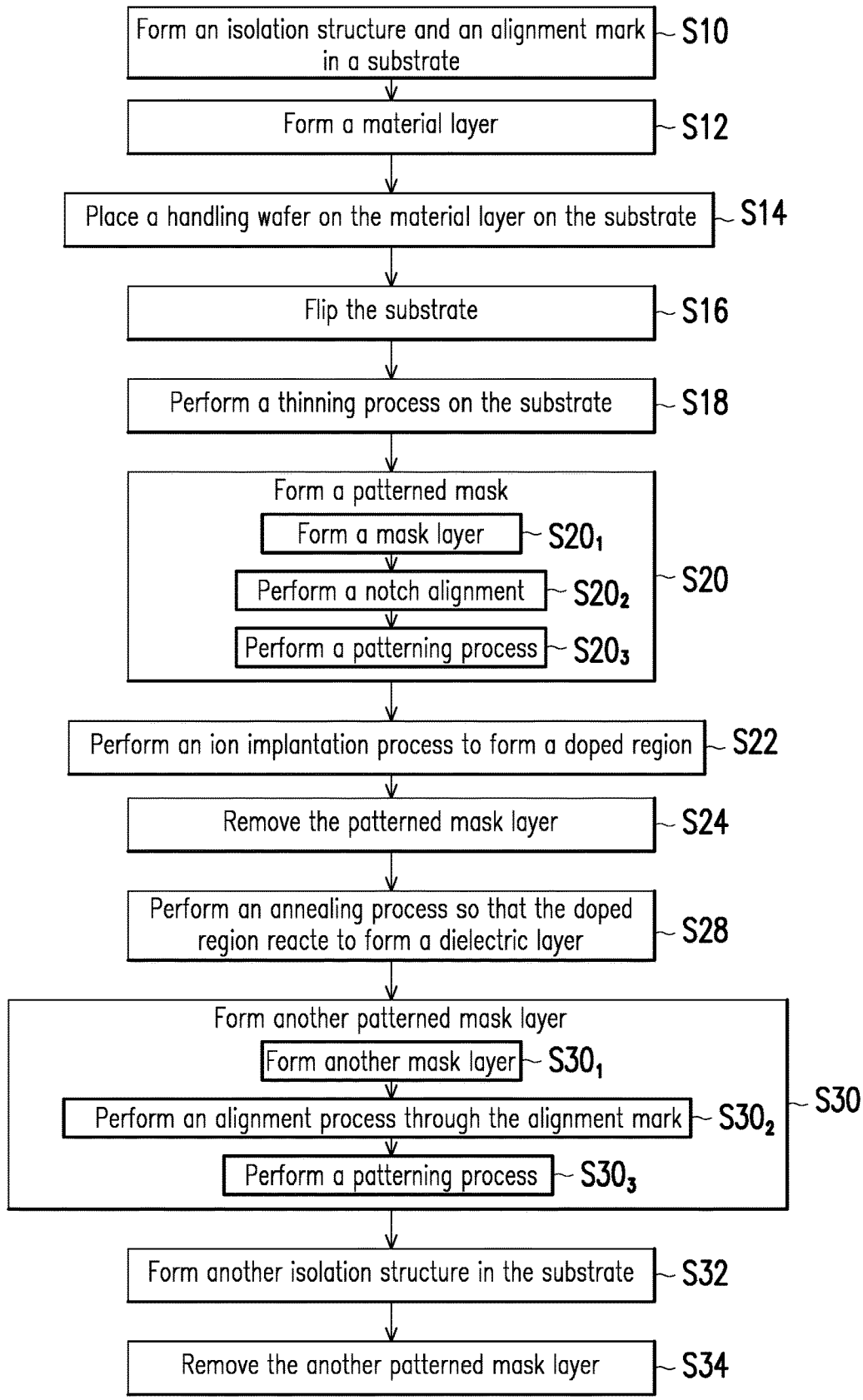
FIG. 6 shows a flowchart of a method for manufacturing a semiconductor device.

FIGS. 1A to 1H are schematic cross-sectional views of a method for manufacturing a semiconductor device according to a first embodiment of the invention. FIG. 6 shows a flowchart of a method for manufacturing a semiconductor device.

Figure 1A:
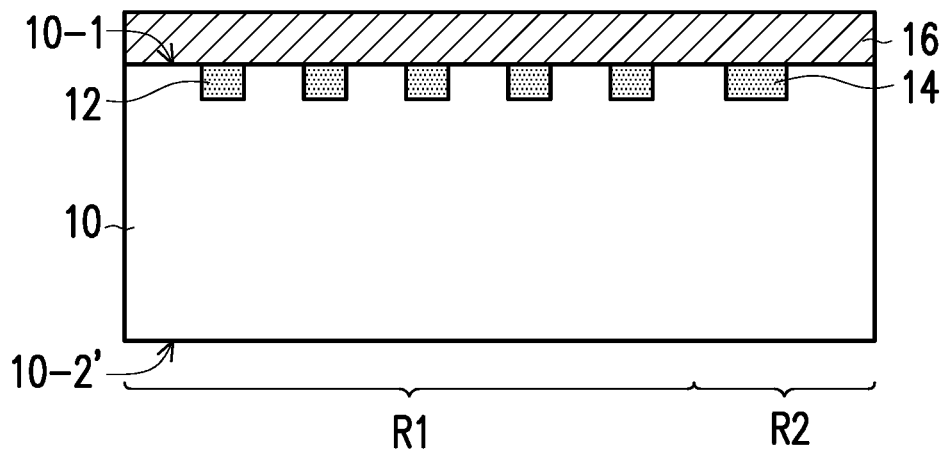
FIGS. 1A to 1H are schematic cross-sectional views of a method for manufacturing a semiconductor device according to a first embodiment of the invention.

Referring to FIG. 1A, a substrate 10 is provided. The substrate 10 includes a first region R1 and a second region R2. In some embodiments, the first region R1 is a chip region, and the second region R2 is a scribe line. In another embodiment, both the first region R1 and the second region R2 are two adjacent regions in the chip region. The substrate 10 may be a doped silicon substrate, an undoped silicon substrate, a silicon on insulator (SOI) substrate, or an epitaxial substrate. The dopants of the doped silicon substrate may be P-type dopants, N-type dopants, or a combination thereof.

Referring to FIG. 1A and an action S10 of FIG. 6, isolation structures 12 are formed in the substrate 10 in the first region R1 to define an active region in the substrate 10, and an alignment mark 14 is formed in the substrate 10 in the second region R2. The materials of the isolation structures 12 and the alignment mark 14 may be the same or different. The isolation structures 12 and the alignment mark 14 include an insulating material, such as silicon oxide, silicon nitride, or a combination thereof. The isolation structures 12 and the alignment mark 14 may be formed by a shallow trench isolation process. In some embodiments, the isolation structures 12 and the alignment mark 14, which extend from the surface 10-1 of the substrate 10 toward the surface 10-2' of the substrate 10, are located at the same level and have the same depth, but not limited thereto. The surface 10-1 of the substrate 10 may be referred to as a front side, and the surface 10-2' may be referred to as a back side.

Figure 2:
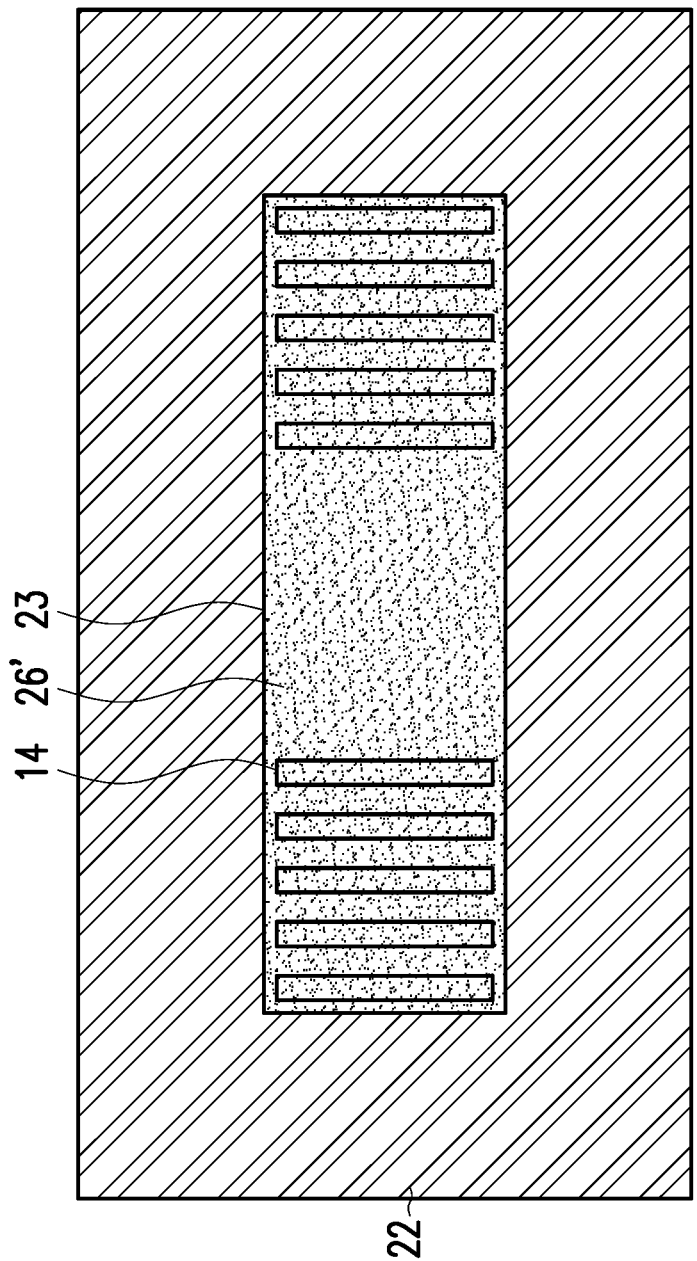
FIGS. 2 illustrates a top view of the second region shown in FIG. 1E.

Referring to FIGS. 1A and 2, the alignment mark 14 of the second region R2 may have various shapes. For example, the alignment mark 14 may include multiple sets of structures. Each set of structures includes a plurality of strips spaced apart and parallel to each other, and the strips and the substrate 10 are alternately arranged with each other, but not limited thereto.

Next, referring to FIG. 1A and an action S12 of FIG. 6, a material layer 16 is formed on the surface 10-1 of the substrate 10. The surface 10-1 may also be referred to as a first surface 10-1. The material layer 16 may include a device layer and a metal interconnection structure. The device layer is, for example, an active device or a passive device. The active device is, for example, a transistor, a diode, or a combination thereof. The passive device is, for example, a resistor, a capacitor, an inductor, or a combination thereof. The metal interconnection structure is used to connect the devices in the device layer. The metal interconnection structure may include multiple dielectric layers and multiple conductive features. The conductive features may connect two or more devices in the device layer. The conductive features include contacts, vias and conductive lines. The conductive lines extend on planes parallel to the surface 10-1 of the substrate 10, and a plurality of vias extend in a direction perpendicular to the surface 10-1 of the substrate 10 to connect two adjacent conductive lines in the vertical direction.

In some embodiments, before forming the isolation structures 12 and the alignment mark 14, or after forming the isolation structures 12 and the alignment mark 14 and before forming the material layer 16, various steps may also be included. For example, a variety of P-type or N-type conductive well regions, deep well regions, doped regions and other processes may be formed in substrate 10.

Figure 1B:
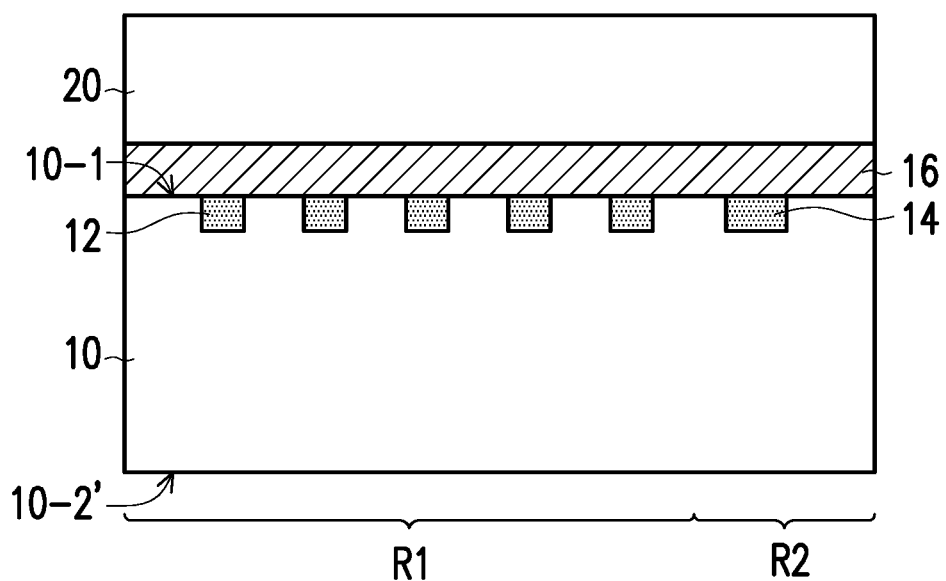

Referring to FIG. 1B and an action S14 of FIG. 6, a handling wafer 20 is placed on the material layer 16 on the substrate 10. The handling wafer 20 may be adhered to the material layer 16 through an adhesive layer (not shown). The adhesive layer may be an organic material or a polymer material.

Figure 1C:
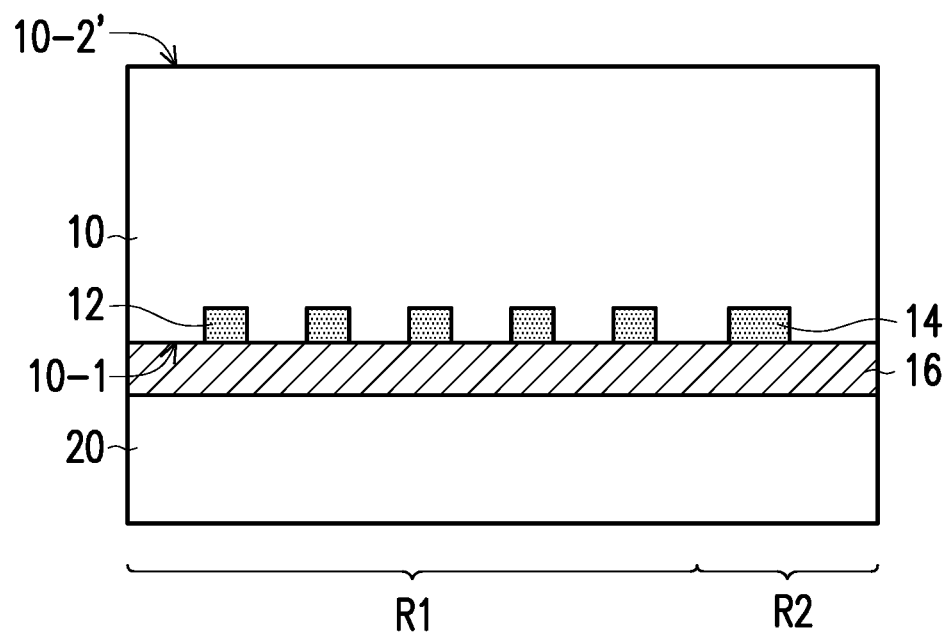
Figure 1D:
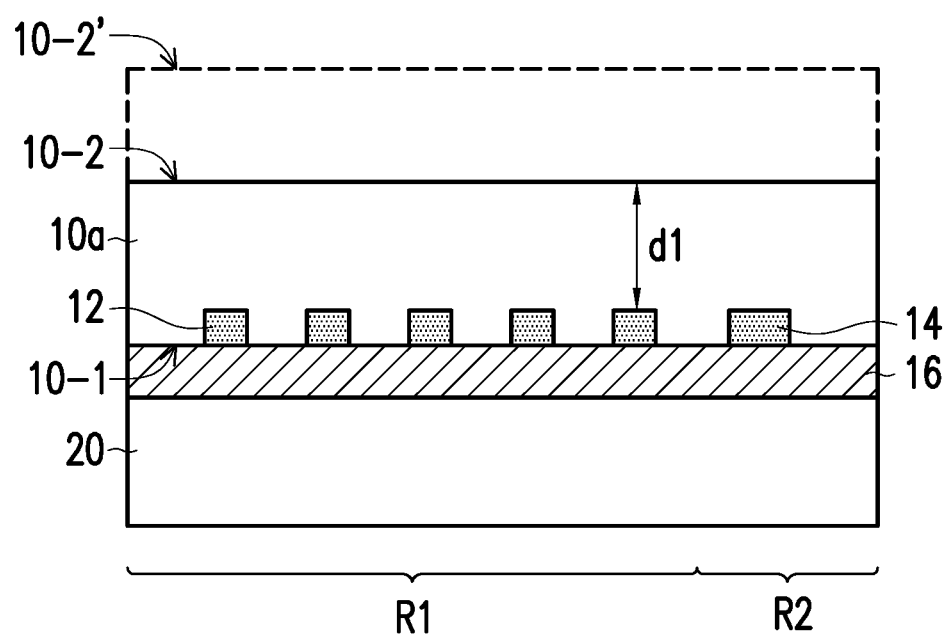

Referring to FIGS. 1C and 1D, and actions S16 and S18 of FIG. 6, the substrate 10 is flipped so that the surface 10-2' of the substrate 10 faces upward. Next, a thinning process is performed on the substrate 10 from the surface 10-2' thereof so as to form a thinned substrate 10a. A surface 10-2 of the substrate 10a may also be referred to as a second surface or a back side. The distance d1 between the surface 10-2 of the substrate 10a and the surface of the isolation structure 12, or the distance d1 between the surface 10-2 of the substrate 10a and the surface of the alignment mark 14 is greater than 4 μm, for example, in a range between 4 μm and 20 μm, or more.

Figure 1E:
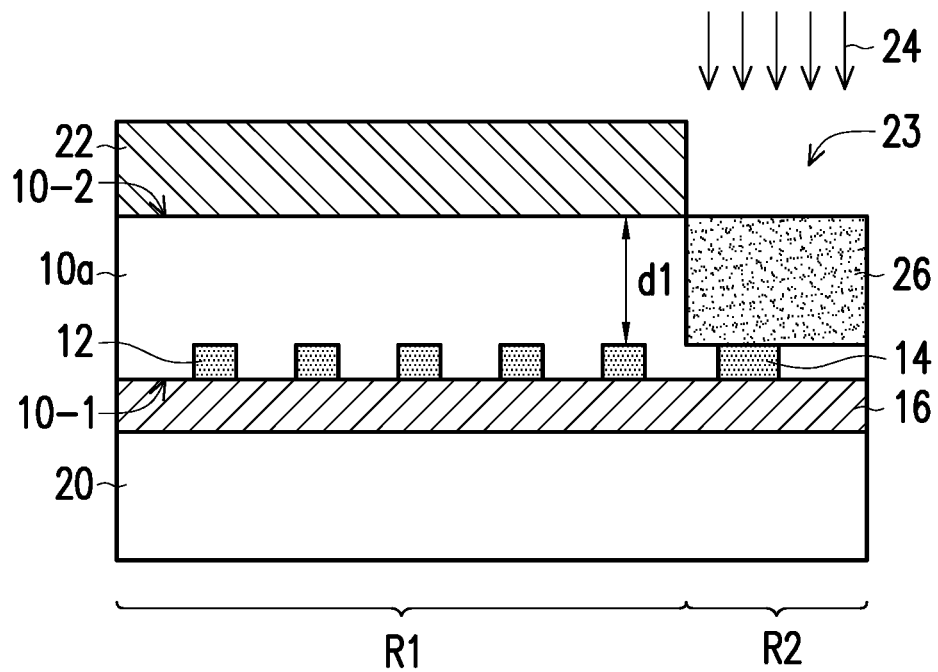

Referring to FIGS. 1E and 2, and action S20 of FIG. 6, a patterned mask layer 22 having opening 23 is formed on the surface 10-2 of the substrate 10a. The surface 10-2 of the substrate 10a in the second region R2 is exposed by the opening 23. The position of the opening 23 overlaps the position of the alignment mark 14, and the area of the opening 23 is larger than the area of the alignment mark 14, and the alignment mark 14 is covered by the opening 23, as shown in FIG. 2. The method for forming the patterned mask layer 22 may be performed by the steps described below, for example.

Referring to FIG. 1E and actions $S20_1$ to $S20_3$ of FIG. 6, a mask layer (for example, a photoresist layer) is coated on the surface 10-2 of the substrate 10a, and then the mask layer (for example, the photoresist layer) is baked. After that, a notch alignment process is performed through aligning a notch of the substrate 10a. Since the opening 23 to be formed only needs to cover the alignment mark 14 in the second region R2, it is not necessary to have a high accuracy. Therefore, the required accuracy may be achieved through the notch alignment process. After that, a patterning process is performed through the exposure and development processes to form the opening 23 in the mask layer 22 (for example, the photoresist layer).

Next, referring to FIG. 1E and an action S22 of FIG. 6, using the mask layer 22 as a mask, an ion implantation process 24 is performed to introduce heteroatoms from the surface 10-2 of substrate 10a into the substrate 10a in the second region R2 so as to form a doped region 26 having heteroatoms therein. The heteroatoms in the doped region 26 are distributed between the surface 10-2 of the substrate 10a and the alignment mark 14. The heteroatoms are, for example, oxygen atoms, nitrogen atoms, or a combination thereof. The dosage of the heteroatoms is, for example, $10^{13}$ to $10^{20}/cm^2$.

Figure 1F:
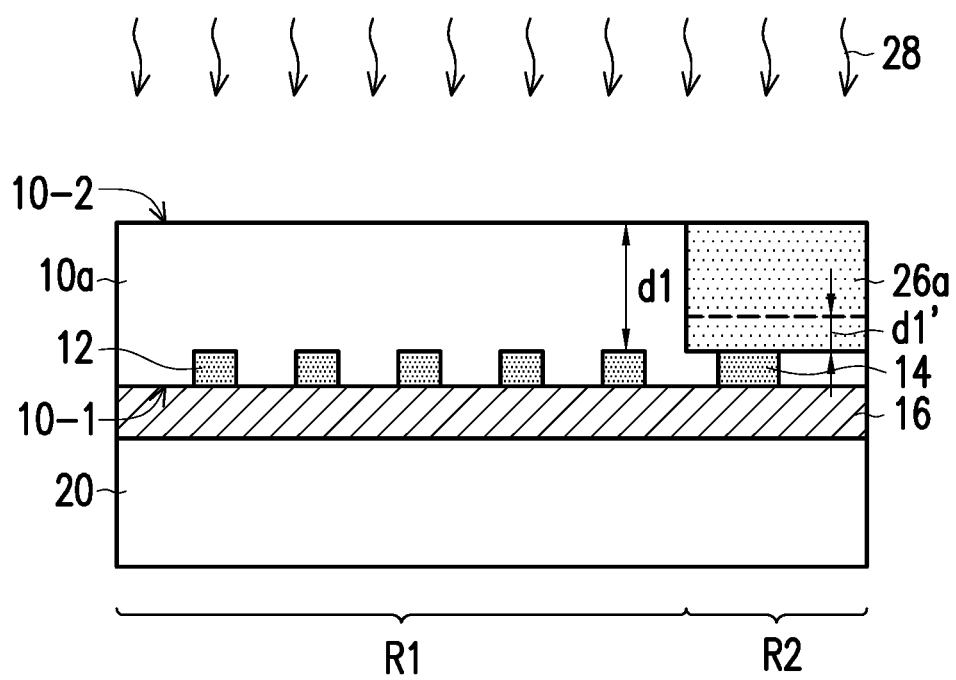

Referring to FIG. 1F and actions S24 and S28 in FIG. 6, the patterned mask layer 22 is removed. Thereafter, an annealing process 28 is performed so that the heteroatoms in the doped region 26 react with silicon of the substrate 10a so as to form a dielectric layer 26a in the substrate 10a in the second region R2. The annealing process 28 may be performed in an atmosphere of nitrogen ($N_2$ ambient) for 30 minutes to 120 minutes, for example. In some embodiments, the temperature of the annealing process 28 is in a range, for example, between 450 degrees Celsius and 1400 degrees Celsius. In other embodiments, the temperature of the annealing process 28 is, for example, between 450 degrees Celsius and 900 degrees Celsius. In still other embodiments, the temperature of the annealing process 28 is, for example, between 450 degrees Celsius and 750 degrees Celsius. The dielectric layer 26a overlaps with the alignment mark 14 in the vertical direction, and the area of the dielectric layer 26a is larger than the area of the alignment mark 14. The material of the dielectric layer 26a is, for example, silicon oxide, silicon oxynitride, or a combination thereof. The refractive index (n value) of the dielectric layer 26a is lower than the refractive index of silicon. The refractive index (n value) of the dielectric layer 26a is in a range between 0 and 2 at visible wavelengths. In some embodiments, the refractive index (n value) of the dielectric layer 26a is less than 1.5 at visible wavelengths. In other embodiments, the refractive index (n value) of the dielectric layer 26a is less than 1.46, or less at visible wavelengths. For example, the refractive index (n value) of the dielectric layer 26a formed by the annealing process at 450 degrees Celsius is about 1.41 at visible wavelengths. The refractive index (n value) of the dielectric layer 26a formed by the annealing process at 600 degrees Celsius is about 1.43 at visible wavelengths. The refractive index (n value) of the dielectric layer 26a formed by the annealing process at 750° C. is about 1.46 at visible wavelengths. The depth of the dielectric layer 26a is in a range of, for example, 4 μm to 20 μm. In this embodiment, the top surface of the dielectric layer 26a is coplanar with the surface 10-2 of the substrate 10a, but it is not limited thereto. The bottom surface of the dielectric layer 26a may be in contact with the alignment mark 14, or separated by a non-zero distance d1'. The range of distance d1' is less than 4 μm, for example.

Figure 1G:
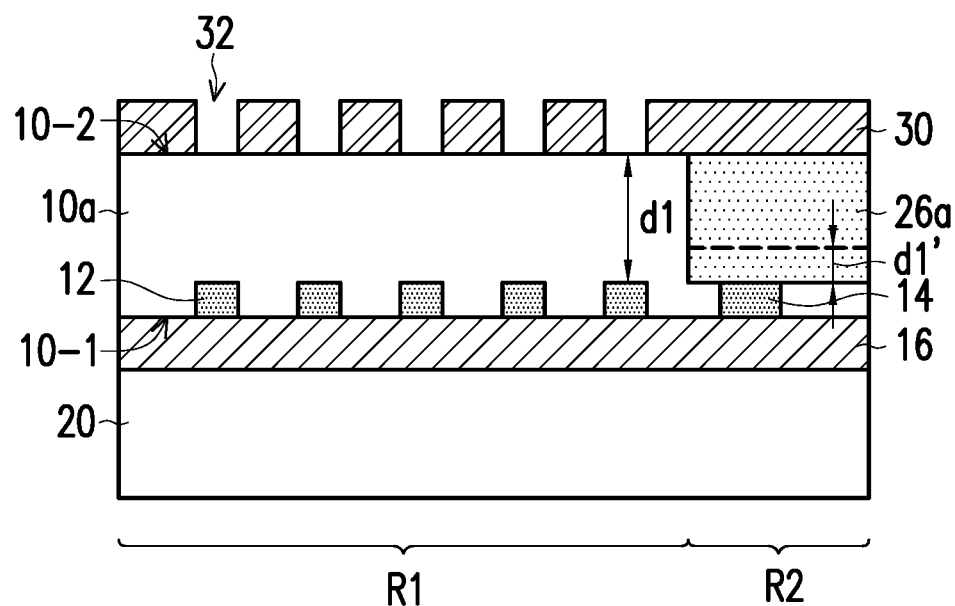

Referring to FIG. 1G and an action S30 of FIG. 6, another patterned mask layer 30 is formed on the surface 10-2 of the substrate 10a. The patterned mask layer 30 has openings 32. The method for forming the patterned mask layer 30 is described in the following steps. Referring to FIG. 1G and actions $S30_1$ to $S30_3$ of FIG. 6, another mask layer (not shown) is formed on the surface 10-2 of the substrate 10a. Another mask layer may include a pad oxide layer, a silicon nitride layer, and a photoresist layer from bottom to top. In the present invention, since the portion of the substrate 10a above the alignment mark 14 has been replaced by the dielectric layer 26a, the thickness of the substrate 10a between the surface 10-1 and the surface 10-2 of the substrate 10a in the second region R2 is less than the thickness of the substrate 10a between the surface 10-1 and the surface 10-2 of the substrate 10a in the region R1. Since the refractive index (n value) of the dielectric layer 26a may be greatly reduced to less than 1.5, and the dielectric layer 26a is transparent under a light irradiation, the alignment process may be performed through the alignment mark 14 in the second region R2. After that, the patterning process of the photoresist layer is performed through the exposure and development processes, and then, the silicon nitride layer and the pad oxide layer are etched to form the openings 32.

In the embodiment where the bottom surface of the dielectric layer 26a is in contact with the surface of the alignment mark 14, since there is only the transparent dielectric layer 26a above the alignment mark 14, the patterned mask layer 30 may be formed without a through silicon alignment during the manufacturing process, the light pass through dielectric and not through silicon, so the process has a very high alignment accuracy. In the embodiment where the bottom surface of the dielectric layer 26a and the surface of the alignment mark 14 have the distance d1' therebetween, since the distance d1' is in a range less than 4 μm, the alignment may be achieved by a through (thinned) silicon alignment process. Therefore, the opening 32 may be accurately formed at a desired position. For example, the position of the opening 32 corresponds to the isolation structure 12.

Figure 1H:
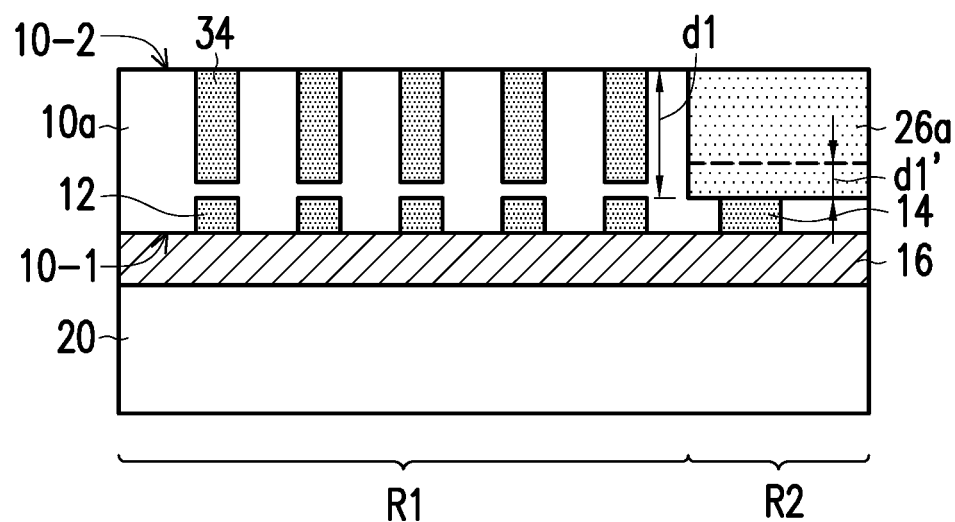

After that, referring to FIG. 1H and actions S32 and S34 of FIG. 6, using the patterned mask layer 30 as a mask, deep trenches (not shown) are formed in the substrate 10a, and then, an insulating material is refilled in the deep trench to form isolation structures 34. The method of refilling the insulating material in the deep trenches are, for example, to form the insulating material, such as silicon oxide, silicon nitride, or a combination thereof on the surface 10-2 of the substrate 10 and fill in the deep trenches. Thereafter, a planarization process is performed to remove excess insulating material. The planarization process is, for example, a chemical mechanical polishing process (CMP). Thereafter, the patterned mask layer 30 is removed. The isolation structure 34 may correspond to, or align to the isolation structures 12. The isolation structures 34 may align a portion of the isolation structures 12. The isolation structures 34 may be in contact with the isolation structures 12 or separated by a non-zero distance. The depth of the isolation structures 34 is in a range of, for example, 4 μm to 20 μm. Because the depth of the isolation structure 34 is quite deep, the isolation structures 34 may be referred to as deep trench isolation structures.

Thereafter, the subsequent process may be, for example, a process of forming a photodiode (PD) region (not shown) on the substrate 10a between two adjacent isolation structures 34. In this embodiment, since the distance d1 between the surface 10-2 of the substrate 10 and the isolation structures 12 is large, and the isolation structures 34 have a deeper depth, the photodiode region formed in the substrate 10a between the isolation structures 34 may have a large area. After that, the process also may include releasing the handling wafer 20 from the substrate 10a and other steps.

FIG. 3A to FIG. 3D are schematic cross-sectional views of a method for manufacturing a semiconductor device according to a second embodiment of the invention.

Figure 3A:
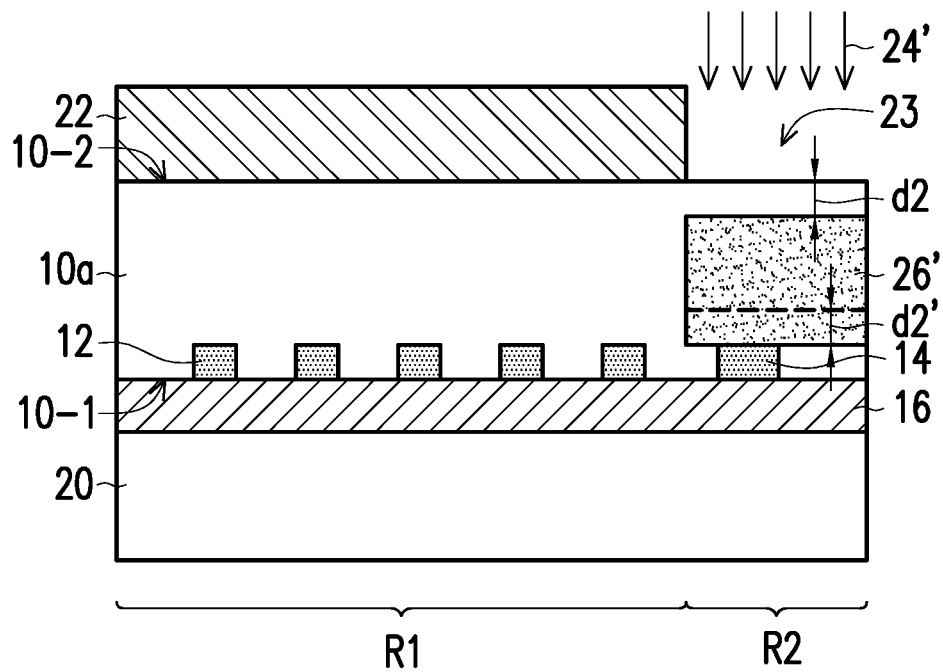
FIGS. 3A to FIG. 3D are schematic cross-sectional views of a method for manufacturing a semiconductor device according to a second embodiment of the invention.

Referring to FIG. 3A and actions S20 and S22 of FIG. 6, after performing the steps corresponding to FIGS. 1A to 1D and the actions S10 to S18 of FIG. 6 according to the method of the first embodiment described above, a patterned mask layer 22 having an opening 23 is formed on the surface 10-2 of the thinned substrate 10a. After that, an ion implantation process 24' is performed to introduce heteroatoms from the surface 10-2 of the substrate 10a into the substrate 10a in the second region R2 so as to form a doped region 26' having heteroatoms therein. The position of doped region 26' is slightly different from the above doped region 26. The top surface of doped region 26' is separated from surface 10-2 of substrate 10a by a non-zero distance d2. The type of the heteroatoms in the doped region 26' may be the same as the type of the heteroatoms in the doped region 26. The dosage of the heteroatoms in doped region 26' may be the same as the dosage of the heteroatoms in doped region 26. However, in this embodiment, the energy of the ion implantation process 24' is different from the energy of the ion implantation process 24, so that the top surface of the doped region 26' is separated from the surface 10-2 of the substrate 10a by a non-zero distance d2.

Figure 3B:
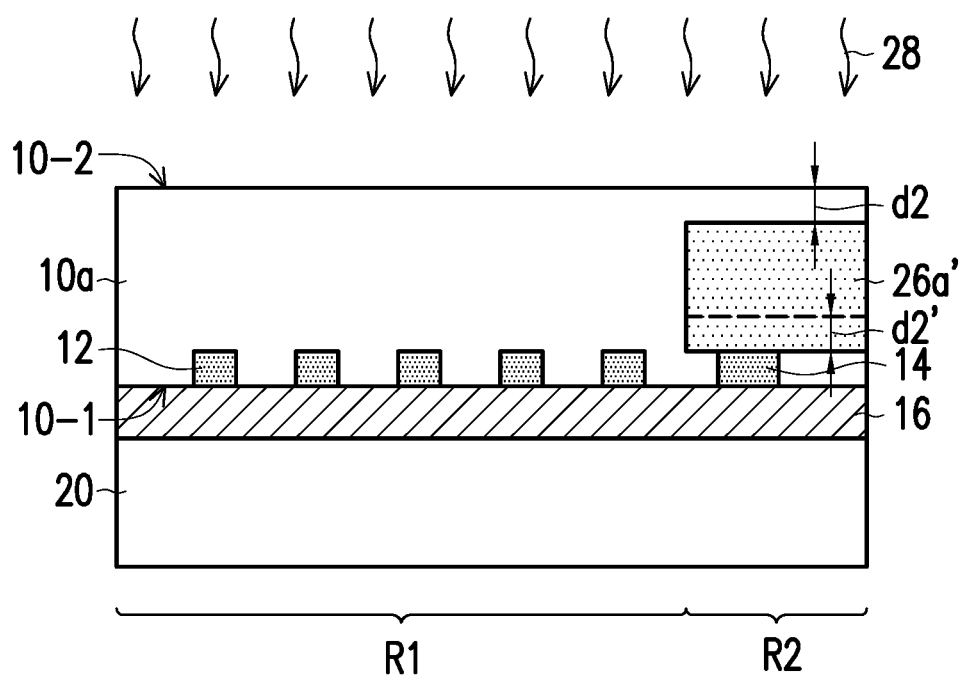

Referring to FIG. 3B and actions S24 and S28 of FIG. 6, the mask layer 22 is then removed according to the method of the first embodiment described above. Thereafter, an annealing process 28 is performed so that the heteroatoms in the doped region 26' react with silicon of the substrate 10a to form a dielectric layer 26a' in the substrate 10a in the second region R2. The temperature of the annealing process 28 is, for example, 450 degrees Celsius to 1400 degrees Celsius. The material and area of the dielectric layer 26a' are similar to those of the dielectric layer 26a, but the top surface of the dielectric layer 26a' is lower than the surface 10-2 of the substrate 10a. In other words, the top surface of the dielectric layer 26a' is still covered by a portion of the substrate 10a. The distance d2 between the top surface of the dielectric layer 26a' and the surface 10-2 of the substrate 10a is, for example, greater than 0 and less than 4 μm. The bottom surface of the dielectric layer 26*a* may be in contact with the alignment mark 14, or separated by a non-zero distance d2'. The range of the sum of distance d2 and d2' is less than 4 µm, for example. However, if the distance d2 or the sum of distance d2 and d2' exceeds 4 µm, that is, the thickness of the substrate 10*a* on the alignment mark 14 is too thick and cannot be transparent under the irradiation of the light, which will result in the through silicon alignment process may not be inaccuracy performed in the subsequent alignment process.

Figure 3C:
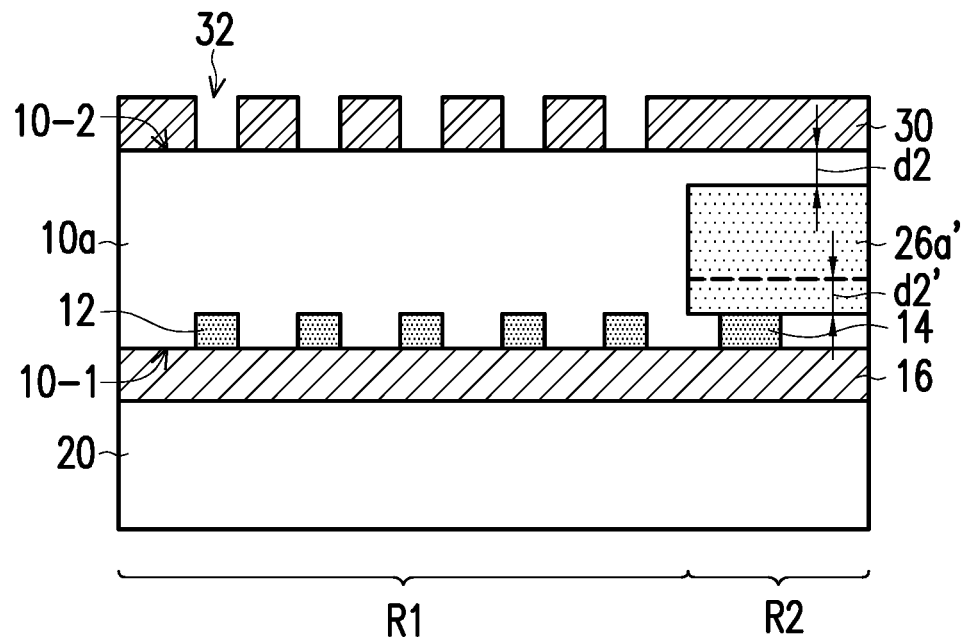

Referring to FIG. 3C and an action S30 of FIG.6, another patterned mask layer 30 is formed on the surface 10-2 of the substrate 10*a*. The patterned mask layer 30 has openings 32. The position of the openings 32 correspond to the isolation structures 12, for example. The method of forming the patterned mask layer 30 may be in accordance with the method of the first embodiment. Although a portion of the substrate 10*a* is remained above the dielectric layer 26*a*', because the thickness of the substrate 10*a* (i.e. distance d2) is quite thin, and the dielectric layer 26*a*' is transparent, the light may pass through the thinned substrate (silicon) and a through silicon alignment (TSA) process may be performed to achieve the purpose of alignment. Similarly, if a portion of the substrate 10*a* is remained between the dielectric layer 26*a*' and the alignment mark 14, the sum of the thickness of the portion of the substrate 10*a* (i.e. distance d2') under the dielectric layer 26*a*' and the thickness of the portion of the substrate 10*a* above the dielectric layer 26*a*' (i.e. distance d2) is less than 4 µm, the through silicon alignment (TSA) process may still be performed to achieve the purpose of alignment.

Figure 3D:
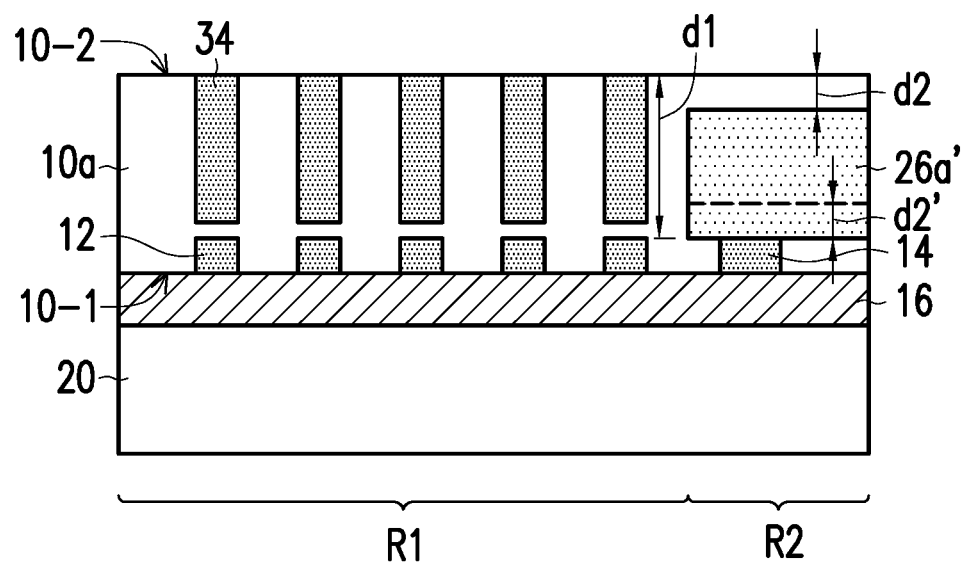

Referring to FIG. 3D and actions S32 and S34 of FIG. 6, isolation structures 34 are formed in the substrate 10*a* according to the method of the first embodiment described above. After that, the patterned mask layer 30 is removed, and then the subsequent process is performed.

According to the above embodiment, the dielectric layer corresponding to the alignment mark in the substrate is formed after the substrate is thinned, however, the invention is not limited thereto. The dielectric layer overlapping with the alignment mark may also be formed before the substrate is thinned, which will be illustrated by the following examples.

Figure 7:
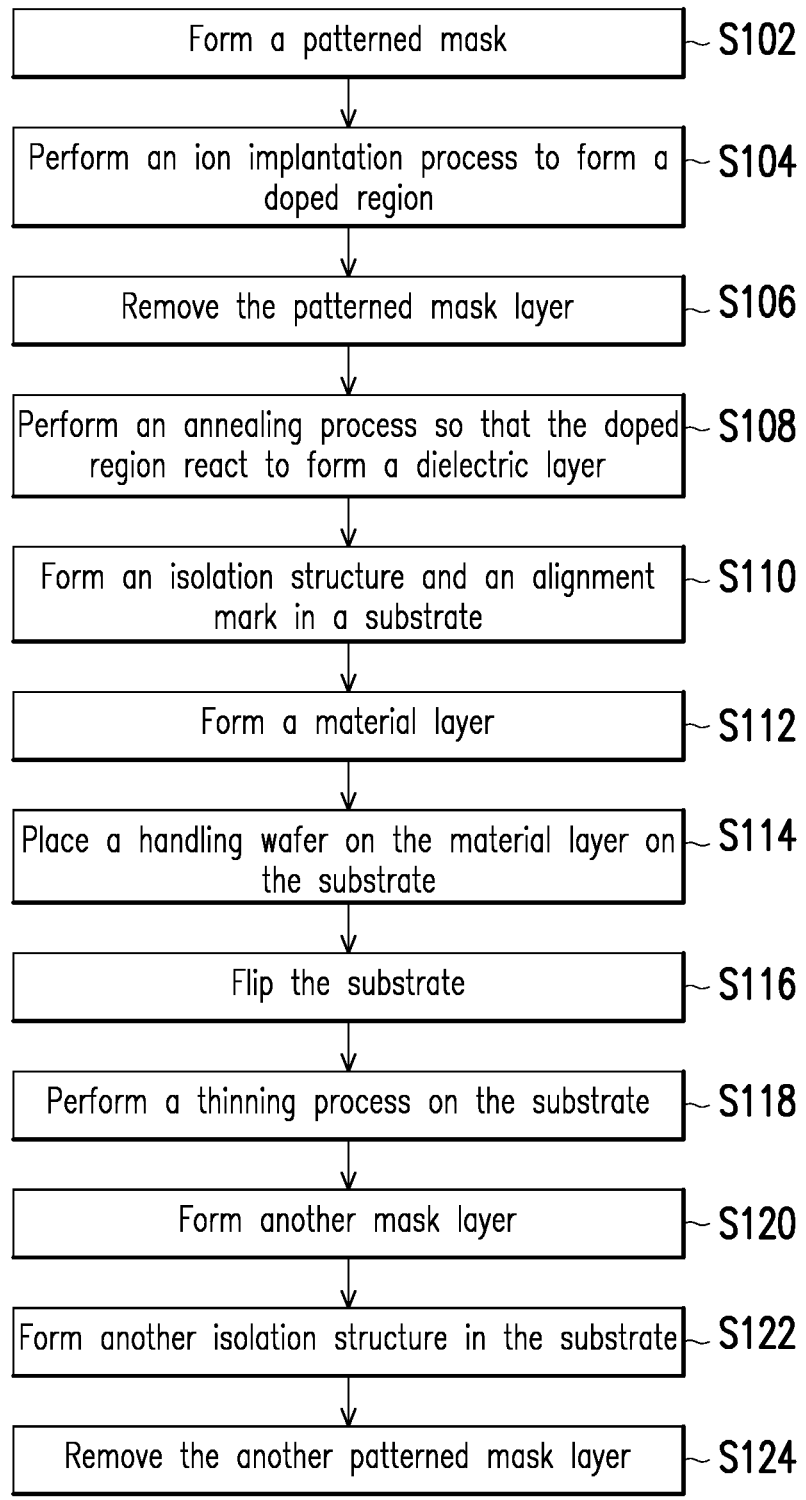
FIG. 7 is a flowchart of another method of manufacturing a semiconductor device.

FIGS. 4A to 4H are schematic cross-sectional views of a method for manufacturing a semiconductor device according to a third embodiment of the invention. FIG. 7 is a flowchart of another method of manufacturing a semiconductor device.

Figure 4A:
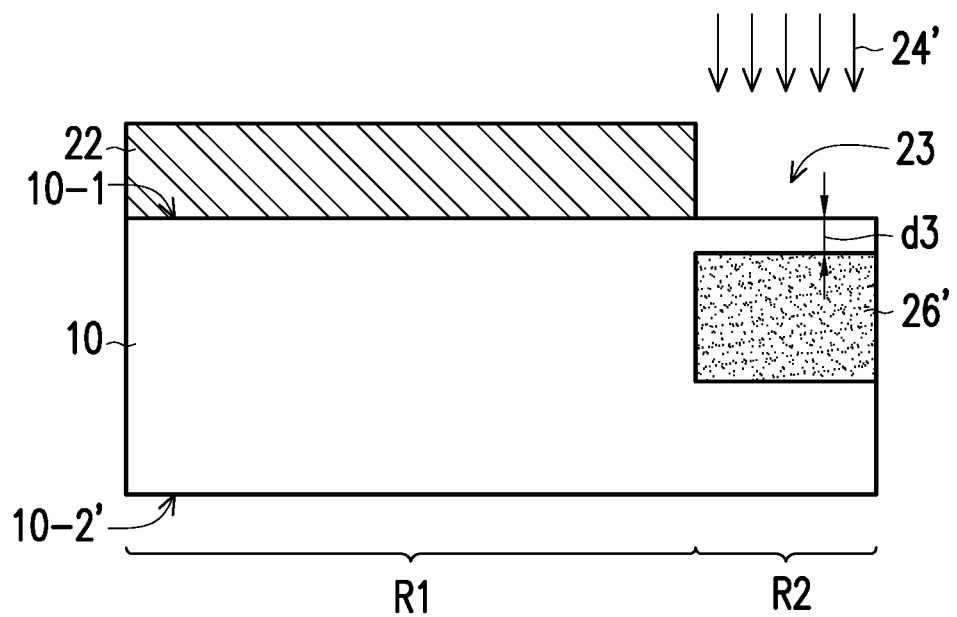
FIGS. 4A to 4H are schematic cross-sectional views of a method for manufacturing a semiconductor device according to a third embodiment of the invention.

Referring to FIG. 4A and actions S102 and S104 of FIG. 7, a patterned mask layer 22 is formed on the surface 10-1 of the substrate 10. The patterned mask layer 22 has an opening 23, which exposes the surface 10-2 of the substrate 10*a* in the second region R2. The patterned mask layer 22 may be formed by using the method of the first embodiment described above.

Next, an ion implantation process 24' is performed to introduce heteroatoms from the surface 10-1 of the substrate 10*a* into the substrate 10*a* in the second region R2 so as to form a doped region 26' having heteroatoms therein. The ion implantation process 24' may be performed by the ion implantation process 24' described in the second embodiment above, so that the top surface of the doped region 26' is separated from the surface 10-1 of the substrate 10*a* by a non-zero distance d3. The distance d3 is at least equal to or greater than the depth of the alignment mark 14 to be formed later.

Figure 4B:
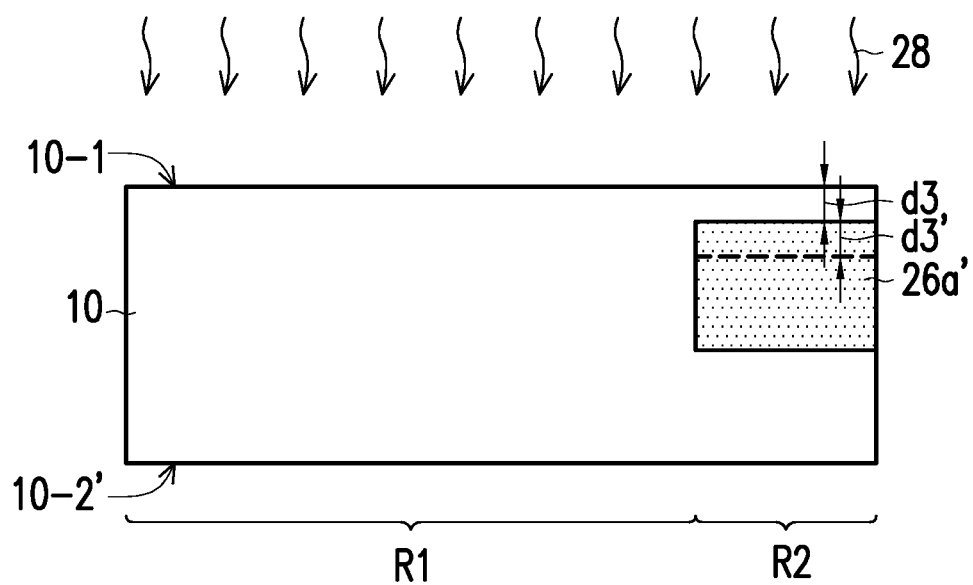

Referring to FIG. 4B and actions S106 and S108 of FIG.7, the patterned mask layer 22 is removed. Thereafter, an annealing process 28 may be optionally performed so that the heteroatoms in the doped region 26' react with the silicon of the substrate 10*a* so as to form a dielectric layer 26*a*' in the substrate 10*a* in the second region R2. The annealing process 28 may be performed by the method of the first embodiment described above. However, the embodiments of the present invention are not limited thereto. In some embodiments, the annealing process 28 may be omitted, and a thermal process to be performed during a subsequent process may be replaced by the annealing process 28. For example, the annealing process 28 may be replaced by a process for the formation of the isolation structure 12, a dopant activation process for the doped region of the material layer 16, or the deposition of the dielectric layer of the metal interconnection structure.

Figure 4C:
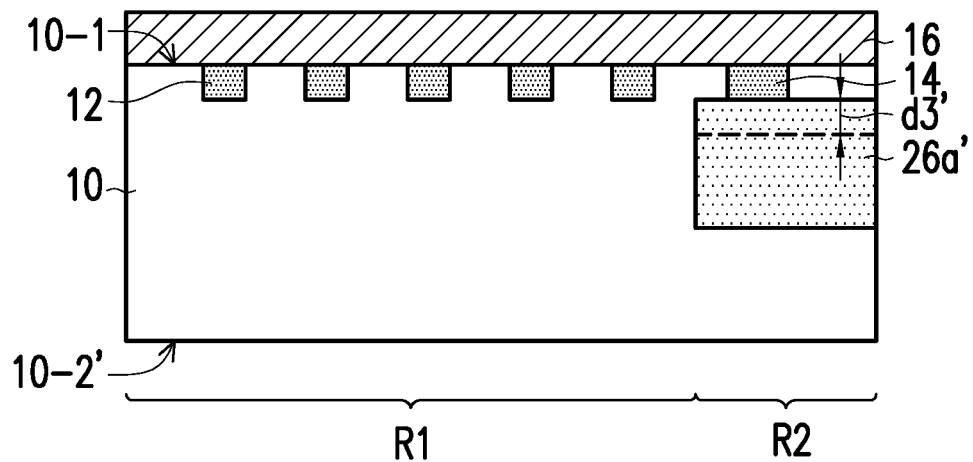

Referring to FIG. 4C and actions S110 and S112 of FIG. 7, the isolation structures 12 and the alignment mark 14 are formed in the substrate 10. The isolation structures 12 are located in the first region R1, and the alignment mark 14 is located in the second region R2 and overlaps with the dielectric layer 26*a* in the vertical direction. After that, a material layer 16 is formed on the isolation structure 12 and the alignment mark 14. The isolation structure 12, the alignment mark 14 and the material layer 16 may be formed according to the method described in the first embodiment described above. The alignment mark 14 may be in contact with the surface of the dielectric layer 26*a*' or may be separated by a non-zero distance d3'. The distance d3' is in a range, for example, greater than 0 and less than 4 µm.

In some alternative embodiments, an ion implantation process 24' used to form the doped region 26' may also be performed after the isolation structure 12 and the alignment mark 14 are formed and before the material layer 16 is formed. Similarly, in some other embodiments, before forming the doped region 26', or before forming the isolation structure 12 and the alignment mark 14, or after forming the isolation structure 12 and the alignment mark 14 and before forming the material layer 16, various steps could be included. For example, a variety of P-type or N-type conductive well regions, deep well regions, doped regions and other processes may be formed in substrate 10.

Figure 4D:
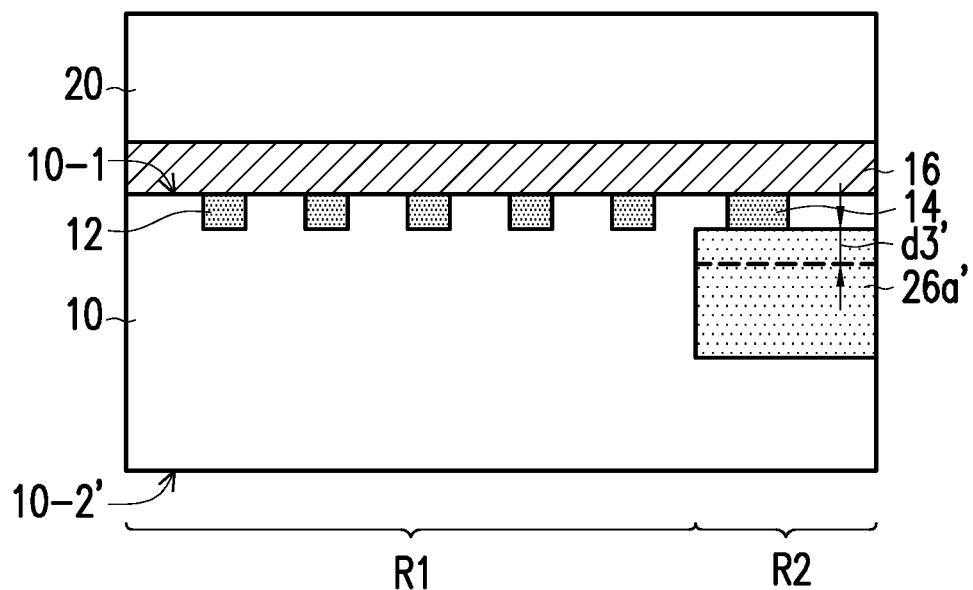
Figure 4E:
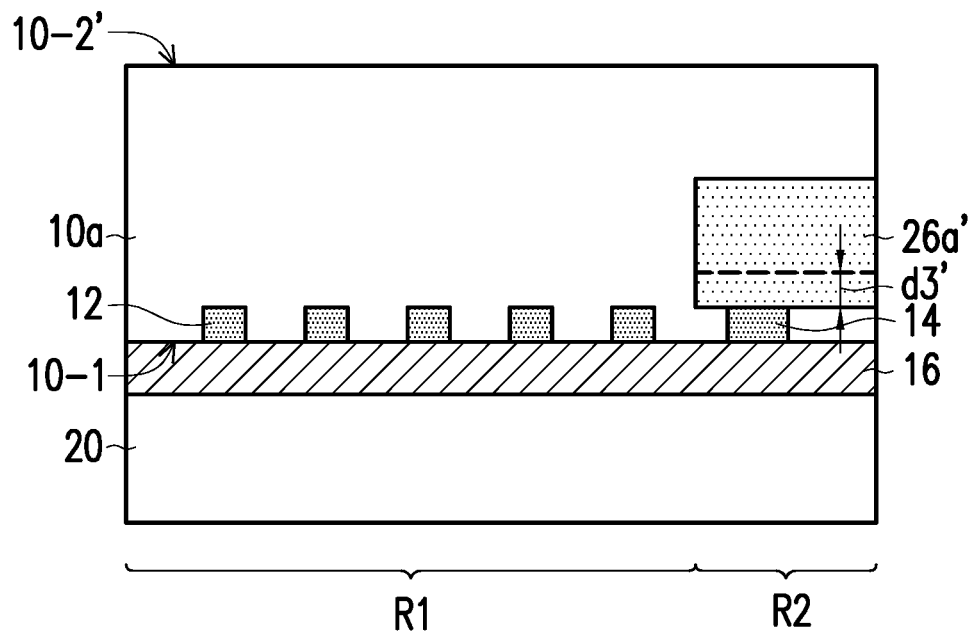
Figure 4F:
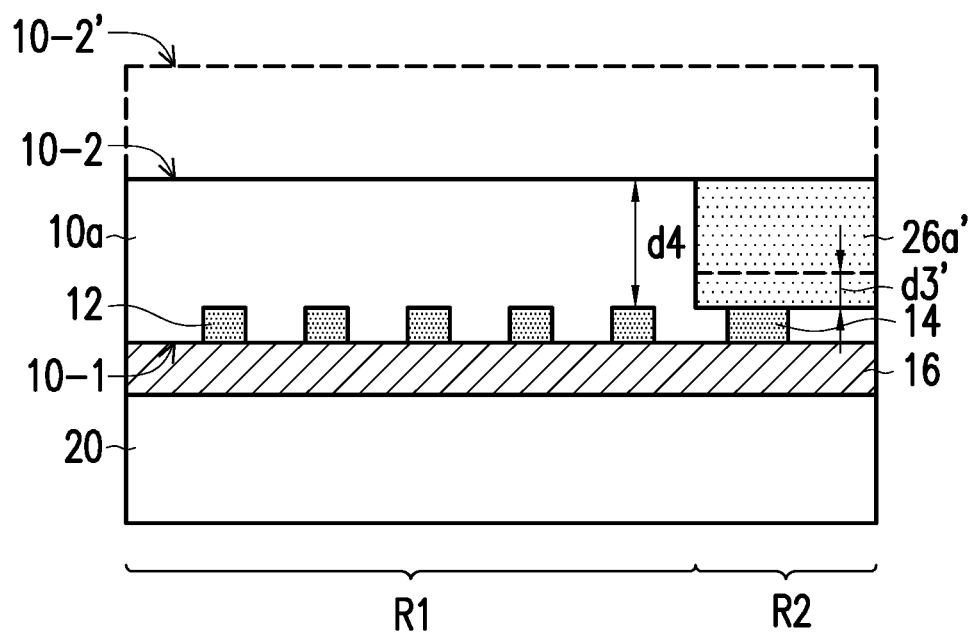

Referring to FIGS. 4D to 4F and actions S114, S116 and S118 of FIG. 7, a handling wafer 20 is placed on the material layer 16 of the substrate 10, and then the handling wafer 20 is flipped so that the substrate 10*a* is located on the handling wafer 20. Thereafter, a thinning process is performed on the substrate 10 so as to form a thinned substrate 10*a*. The distance d4 between the surface 10-2 of the substrate 10*a* and the surface of the isolation structure 12 is greater than 4 µm, for example, between 4 µm and 20 µm, or more. In some embodiments, during the thinning process, the dielectric layer 26*a*' is also thinned. In other some embodiments, during the thinning process of substrate 10, the dielectric layer 26*a*' is not thinned. After the thinning process of substrate 10, the dielectric layer 26*a*' is exposed. The top surface of the dielectric layer 26*a*' is coplanar with the surface 10-2 of the substrate 10*a*. The bottom surface of the dielectric layer 26*a*' is in contact with the surface of the alignment mark 14 or is separated by a non-zero distance d3'. The range of distance d3' is less than 4 µm, for example.

Figure 4G:
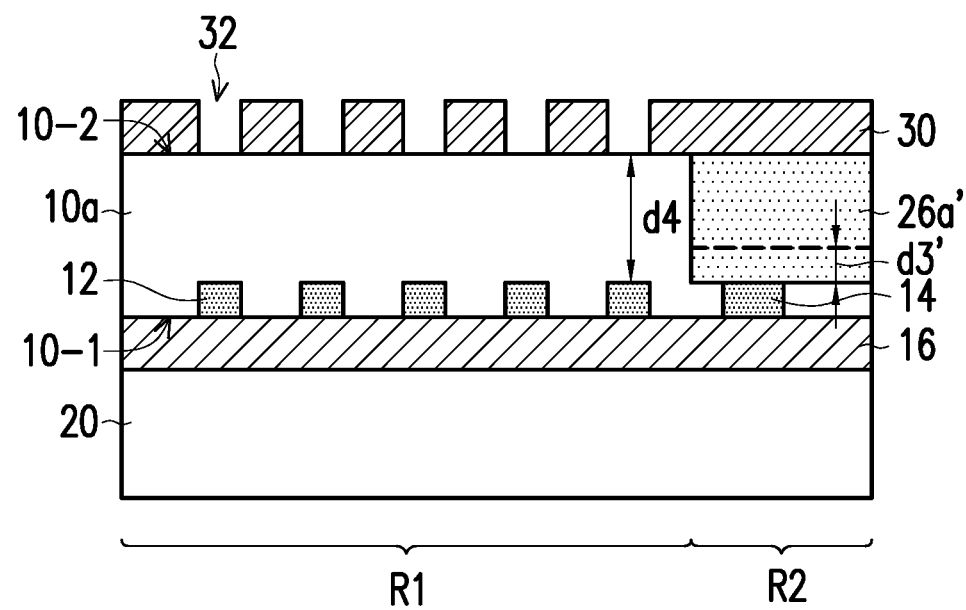

Referring to FIG. 4G and an action S120 of FIG.7, a patterned mask layer 30 having openings 32 is formed on the surface 10-2 of the substrate 10*a* according to the method of the first embodiment described above. Similarly, the bottom surface of the dielectric layer 26*a*' is in contact with the surface of the alignment mark 14 or there is the distance d3' between the bottom surface of the dielectric layer 26a' and the surface of the alignment mark 14. During forming the patterned mask layer 30, a non-through silicon alignment process or a through (thin) silicon alignment process may be performed, and a light may directly penetrate the transparent dielectric layer 26a' or pass through the thin silicon to propagate to the alignment mark 14 so as to achieve the purpose of alignment through the alignment mark 14.

Figure 4H:
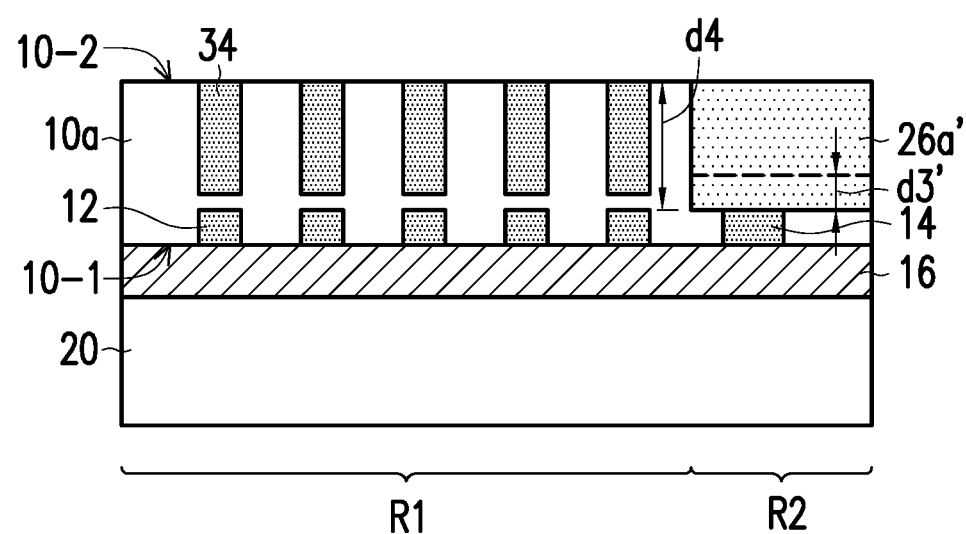

Referring to FIG. 4H and actions S122 and S124 of FIG. 7, isolation structures 34 are formed in the substrate 10a according to the method of the first embodiment described above. After that, the patterned mask layer 30 is removed, and then the subsequent process is performed.

Figure 5A:
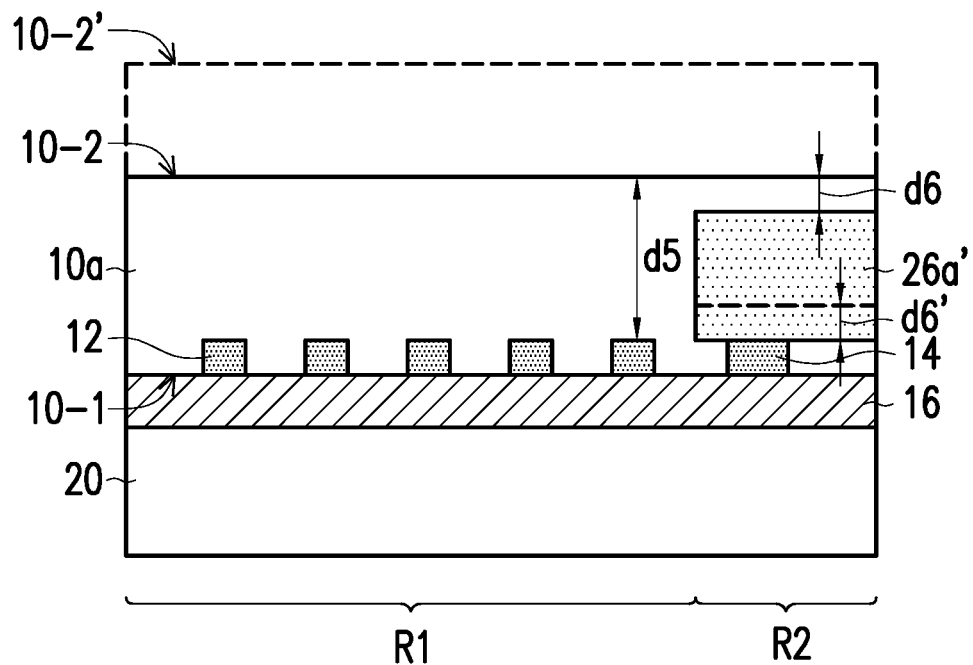
FIGS. 5A to 5B are schematic cross-sectional views of a method for manufacturing a semiconductor device according to a fourth embodiment of the invention.
Figure 5B:
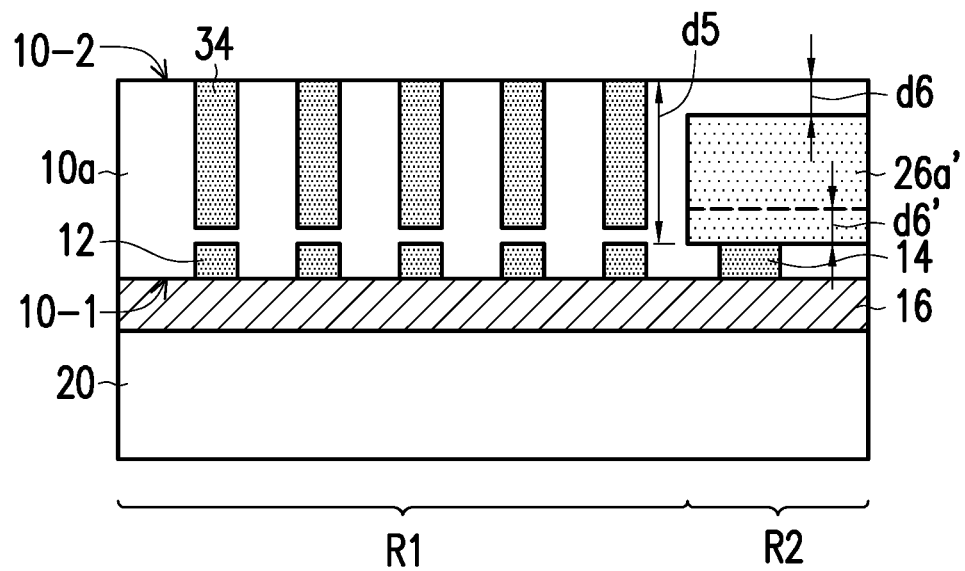

FIGS. 5A to 5B are schematic cross-sectional views of a method for manufacturing a semiconductor device according to a fourth embodiment of the invention.

Referring to FIG. 5A and actions S118 of FIG. 7, after performing the steps corresponding to FIGS. 4A to 4D and the actions S102 to S116 of FIG. 7 according to the method of the third embodiment described above, after the substrate 10 is flipped and the surface 10-2 of the substrate 10 faces upward, a thinning process is performed on the substrate 10 from the surface 10-2' thereof so as to form a substrate 10a. The distance d5 between the surface 10-2 of the substrate 10a and the surface of the isolation structure 12 is, for example, 4 µm to 20 µm. In this embodiment, the substrate 10a does not expose the top surface of the dielectric layer 26a during the thinning process. Therefore, the surface 10-2 of the substrate 10a is higher than the top surface of the dielectric layer 26a', and the top surface of the dielectric layer 26a' is covered by a portion of the substrate 10a. In other words, the distance d6 between the top surface of the dielectric layer 26a' and the surface 10-2 of the substrate 10a is, for example, greater than 0 and less than 4 µm. However, if the distance d6 exceeds 4 µm, the thickness of the substrate 10a on the dielectric layer 26a' is too thick to be transparent under the irradiation of the light, resulting in inaccurate silicon alignment.

Similarly, the bottom surface of the dielectric layer 26a' may be in contact with the alignment mark 14, or separated by a non-zero distance d6'. The range of the sum of the distances d6 and d6' is less than 4 µm, for example.

Referring to FIG. 5B and actions S120 to S124 of FIG. 7, isolation structures 34 are formed in the substrate 10a according to the steps of FIGS. 4G and 4H corresponding to the above third embodiment. After that, the subsequent process is performed. Similarly, since the distance d6 or the sum of the distances d6 and d6' is less than 4 µm, the alignment process may be achieved by a through (thin) silicon alignment process during the formation of the isolation structure 34.

In summary, in the embodiments of the present invention described above, the thickness of the substrate above the alignment mark may be reduced by forming a dielectric layer overlapping the alignment mark in the substrate. Because the thickness of the substrate above the alignment mark is relatively thin, the photolithographic process may be performed by using a through (thin) silicon alignment process or a non-through silicon alignment process when manufacturing components on or from the back side of the substrate. Therefore, the method of the embodiment of the present invention provide a thinned substrate having a sufficient thickness, and may improve the accuracy of the alignment of the back side of a wafer.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
a substrate including a first region and a second region;
an isolation structure disposed in the substrate in the first region, wherein the isolation structure extends from a first surface of the substrate toward a second surface of the substrate;
an alignment mark in the substrate in the second region, wherein the alignment mark extends from the first surface of the substrate toward the second surface of the substrate and at the same level as the isolation structure;
another isolation structure corresponds to the isolation structure disposed in the substrate in the first region, wherein the another isolation structure extends from the second surface of the substrate toward the first surface of the substrate and aligned to the isolation structure;
a dielectric region buried in the substrate in the second region and overlapping the alignment mark, wherein heteroatoms are ion implanted and annealed to form the dielectric region having a refractive index (n value) less than 1.5 and coplanar with a top surface of the another isolation structure; and
wherein a thickness of a portion of the substrate from the top surface of the another isolation structure to a top surface of the isolation structure is between 4 µm to 20 µm or more and a thickness of a portion of the substrate from a top surface of the alignment mark towards the second surface of the substrate is less than 4 um and greater than 0 um.

2. The semiconductor device of claim 1, wherein both the first region and the second region are in a chip region.

3. The semiconductor device of claim 1, wherein the dielectric region comprises silicon oxide, silicon nitride, or a combination thereof.

4. The semiconductor device of claim 1, wherein the dielectric region extends from the second surface of the substrate toward the first surface of the substrate.

5. The semiconductor device of claim 4, wherein a bottom surface of the dielectric region is in contact with the alignment mark.

6. The semiconductor device of claim 4, wherein a bottom surface of the dielectric region is separated from the alignment mark by the portion of the dielectric region.

7. The semiconductor device of claim 6, wherein the thickness of the portion of the substrate is less than a distance between a bottom of the isolation structure and the second surface of the substrate.

8. The semiconductor device of claim 1, wherein the dielectric region overlaps with the alignment mark the dielectric layer in a vertical direction.

9. The semiconductor device of claim 1, wherein the alignment mark and the isolation structure have a same level.

10. The semiconductor device of claim 1, wherein the alignment mark and the isolation structure have a same depth.

* * * * *